United States Patent [19]
Weeks et al.

[11] Patent Number: 5,783,487
[45] Date of Patent: Jul. 21, 1998

[54] METHOD OF COUPLING TITANIUM TO A SEMICONDUCTOR SUBSTRATE AND SEMICONDUCTOR DEVICE THEREOF

[75] Inventors: Anthony R. Weeks, Gilbert; Vincent J. Kasarskis, Jr., Scottsdale; Henry L. Eudy, Jr., Tempe, all of Ariz.

[73] Assignee: Motorola, Inc., Schaumburg, Ill.

[21] Appl. No.: 603,294

[22] Filed: Feb. 20, 1996

[51] Int. Cl.$^6$ .................................................. H01L 21/44
[52] U.S. Cl. ........................................... 438/685; 438/656
[58] Field of Search .................................. 438/650, 656, 438/685, 758, 759, 785

[56] References Cited

U.S. PATENT DOCUMENTS

| | | |
|---|---|---|
| 4,417,387 | 11/1983 | Heslop . |
| 4,713,260 | 12/1987 | Roberts et al. . |
| 4,793,854 | 12/1988 | Shimotori et al. ............... 438/685 |
| 5,236,868 | 8/1993 | Nulman .............................. 438/685 |
| 5,360,765 | 11/1994 | Kondo et al. . |
| 5,449,640 | 9/1995 | Hunt et al. ........................ 438/653 |

*Primary Examiner*—Kevin Picardat
*Attorney, Agent, or Firm*—George C. Chen

[57] ABSTRACT

A semiconductor device (10) includes a semiconductor substrate (11) underlying an oxide layer (12). A layer (13) comprised of titanium overlies the oxide layer (12). The oxide layer (12) improves the adhesion of the layer (13) comprised of titanium to the semiconductor substrate (11).

14 Claims, 1 Drawing Sheet

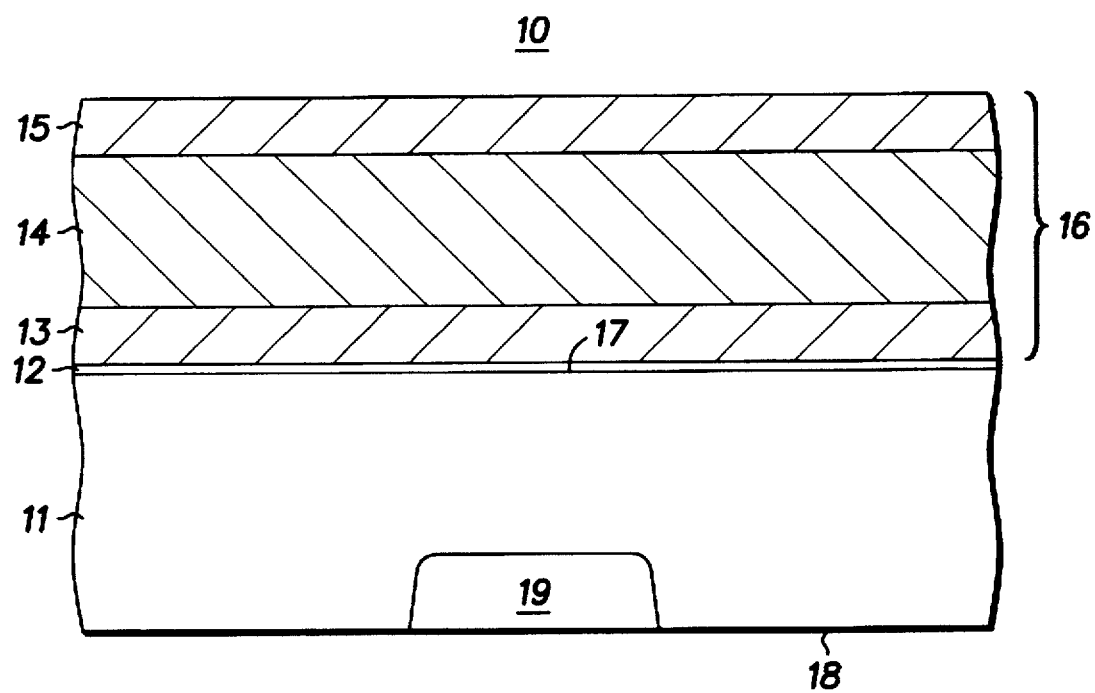

METHOD OF COUPLING TITANIUM TO A SEMICONDUCTOR SUBSTRATE AND SEMICONDUCTOR DEVICE THEREOF

BACKGROUND OF THE INVENTION

This invention relates, in general, to semiconductor devices, and more particularly, to semiconductor devices having a layer comprised of titanium.

As known in the art, the back surface of a silicon chip is typically mounted onto a leadframe. To improve the adhesion between the silicon chip and the leadframe, backmetals are often disposed onto the back surface of the silicon chip. In many backmetal structures, titanium is used to couple the backmetal to the silicon chip. However, strong adhesion between the titanium and the silicon chip is difficult to achieve, and when the adhesion is weak, the backmetal peels off of the silicon chip during subsequent processing or during use of the silicon chip. Consequently, the poor adhesion between the backmetal and the silicon chip produces significant reliability problems.

Accordingly, a need exists for a method of reliably adhering titanium to a silicon chip. The method should be cost-effective, should be compatible with existing semiconductor processing techniques, and should not significantly increase the cycle time of fabricating a semiconductor device.

BRIEF DESCRIPTION OF THE DRAWING

The single FIGURE illustrates a partial cross-sectional view of an embodiment of a semiconductor device in accordance with the present invention.

DETAILED DESCRIPTION OF THE DRAWING

Turning to the single FIGURE for a more detailed description, the single FIGURE illustrates a partial cross-sectional view of an embodiment of a semiconductor device 10. Semiconductor device 10 includes a semiconductor substrate 11 and a metal structure 16.

Semiconductor substrate 11 has a device surface 18 and is comprised of a semiconductor such as, for example, silicon or gallium arsenide. At least one transistor 19 is fabricated in surface 18 using semiconductor processing techniques known to those skilled in the art. Transistor 19 can be a bipolar transistor, a field effect transistor, or the like. Because transistor 19 can have many different structures, the depicted structure is only for the purpose of illustrating transistor 19. Other features such as, for example, interconnect lines (not shown) and a passivation layer (not shown) can also be fabricated over surface 18 and transistor 19.

After the fabrication of transistor 19 in surface 18, semiconductor substrate 11 is thinned using grinding or etching techniques. After the thinning process, semiconductor substrate 11 has a support surface 17 that is opposite surface 18.

In the prior art, the thinning process is used to produce a rough topography on the semiconductor substrate surface. Typically, the substrate surface is roughened to form irregular patterns or contours having average peak-to-valley distances of at least approximately 500 nanometers (nm). In other words, the irregularities or nonuniformities across the substrate surface often have a minimum distance of about 500 nm as measured from a high point on the substrate surface to an adjacent low point on the substrate surface. The substrate surface is roughened in an attempt to improve the mechanical adhesion or mechanical bond between the substrate surface and the subsequently deposited backmetal. However, the roughened substrate surface weakens the semiconductor substrate and increases the susceptibility of the semiconductor substrate to crack, fracture, or break.

However, the thinning process used to fabricate semiconductor device 10 produces a substantially smooth or planar surface for surface 17 of semiconductor substrate 11. Preferably, surface 17 has an average peak-to-valley distance of approximately 15 to 100 nm and has a maximum peak-to-valley distance of less than approximately 500 nm to maintain the strength of semiconductor substrate 11.

After the thinning process, the prior art exposes the semiconductor substrate surface to a surface preparation step or a surface treatment technique before disposing a backmetal on the substrate surface. Examples of prior art surface treatment techniques include, but are not limited to, sputter etching, plasma etching, fume etching, or aqueous solution etching. The prior art surface preparation techniques remove a thin native oxide layer off of the semiconductor substrate surface before forming a backmetal on the substrate surface. The native oxide layer is approximately 25 angstroms (Å) thick and can grow on the substrate surface in ambient at room temperature. The thin native oxide layer is removed in an attempt to increase the adhesion and to reduce the electrical contact resistance between the substrate surface and the backmetal.

However, a surface preparation technique is not used before disposing metal structure 16 over surface 17 of semiconductor substrate 11. By eliminating the prior art surface preparation technique, the cycle time and cost for manufacturing semiconductor device 10 are both reduced.

Unlike the prior art, semiconductor device 10 uses an oxide layer 12 to improve the adhesion between metal structure 16 and surface 17. As explained hereinafter, oxide layer 12 is preferably comprised of silicon dioxide ($SiO_2$). In one embodiment, oxide layer 12 is a native oxide layer that is less than approximately 40 Å thick. In another embodiment, surface 17 is exposed to an oxygen rich ambient to facilitate or promote the growth of oxide layer 12, and because oxide layer 12 is grown from semiconductor substrate 11, oxide layer 12 may include dopants used in semiconductor substrate 11. When semiconductor device 10 has interconnect lines (not shown) comprised of aluminum to electrically couple transistor 19, oxide layer 12 should be grown at a temperature below approximately 450 degrees Celsius (°C.) to prevent deformation of the interconnect lines.

In an embodiment where metal structure 16 is used to provide electrical coupling to semiconductor substrate 11, oxide layer 12 should have a thickness less than approximately 150 Å. In this embodiment, oxide layer 12 is not thick enough to serve as an electrical insulator between metal structure 16 and semiconductor substrate 11. Instead, the electrical signal conducted by metal structure 16 can be conducted through oxide layer 12 and into semiconductor substrate 11 as explained hereinafter.

Metal structure 16 includes an adhesion layer 13 of titanium, which couples or attaches metal structure 16 to oxide layer 12 and semiconductor substrate 11. In one embodiment, layer 13 is approximately one hundred percent titanium, and in another embodiment, it is believed that layer 13 can be a metallic alloy having more than approximately 20 percent by weight of titanium. Layer 13 overlies oxide layer 12 and should have a thickness of at least approximately 200 Å to ensure uniformity of layer 13 and to provide sufficient adhesion between metal structure 16 and oxide layer 12.

The titanium of layer 13 forms a chemical bond with oxide layer 12 because titanium getters oxygen. This chemical bond is stronger than the mechanical bond used in the prior art when the substrate surface is intentionally roughened. The chemical bond is the strongest when oxide layer 12 consists essentially of silicon dioxide. Therefore, as discussed previously, oxide layer 12 preferably consists essentially of silicon dioxide to improve the adhesion between oxide layer 12 and layer 13. Thus, because layer 13 uses a chemical bond instead of a mechanical bond, metal structure 16 has a lower probability of peeling off of semiconductor substrate 11 compared to the prior art. Also, because surface 17 of semiconductor substrate 11 is smoother than the prior art, semiconductor substrate 11 also has a lower probability of fracturing compared to the prior art. Accordingly, the reliability of semiconductor device 10 is improved over the prior art.

When oxide layer 12 has a thickness of less than approximately 150 Å, portions of the titanium in layer 13 spike or penetrate through oxide layer 12 to contact semiconductor substrate 11. Therefore, an electrical signal conducted by metal structure 16 can pass through oxide layer 12 to semiconductor substrate 11.

In additional to having layer 13, metal structure 16 also includes an anti-oxidation layer 15 overlying a barrier layer 14. Typically a solder (not shown) is used to attach metal structure 16 to a leadframe (not shown). Barrier layer 14 overlies layer 13 and prevents the solder from diffusing into and contaminating semiconductor substrate 11. When barrier layer 14 is exposed to ambient, barrier layer 14 will oxidize, which reduces its effectiveness as a diffusion barrier. Therefore, anti-oxidation layer 15 overlies barrier layer 14 to prevent the oxidation of barrier layer 14.

As an example, layers 14 and 15 are comprised of approximately 1,500 to 3,000 Å of platinum and approximately 500 to 25,000 Å of gold, respectively. As another example, layers 14 and 15 are comprised of approximately 1,500 to 3,000 Å of platinum and approximately 10,000 to 20,000 Å of an alloy of gold and germanium, respectively. In yet another example, layers 14 and 15 are comprised of approximately 1,500 to 3,000 Å of nickel and approximately 1,000 to 10,000 Å of silver.

Layers 13, 14, and 15 are sequentially provided or disposed over oxide layer 12 and surface 17 by using sputtering, plating, or evaporating techniques. Preferably, layers 13, 14, and 15 are sequentially sputtered in-situ to prevent the interfaces between layers 13, 14, and 15 from oxidizing or from being contaminated. In one embodiment, layers 13, 14, and 15 are deposited in a sputtering tool having a titanium target, a platinum target, and a gold target. A sputter tool such as, for example, a model 903 manufactured by Materials Research Corporation of Orangeburg, N.Y. can hold three sputtering targets.

Therefore, in accordance with the present invention, it is apparent there has been provided an improved semiconductor device having a semiconductor substrate coupled to a layer comprised of titanium that overcomes the disadvantages of the prior art. The present invention improves the reliability of a semiconductor device in areas relating to semiconductor substrate breakage and metal peeling. The present invention reduces both cycle time and cost for manufacturing a semiconductor device by eliminating surface preparation techniques prior to the deposition of a metal structure.

While the invention has been particularly shown and described with reference to preferred embodiments, it will be understood by those skilled in the art that changes in form and detail may be made without departing from the spirit and scope of the invention. For instance, the use of a thin oxide layer to improve titanium adhesion can also be utilized on surface 18 of semiconductor substrate 11 to provide electrical coupling to transistor 19.

We claim:

1. A method of manufacturing a semiconductor device comprising:

providing a semiconductor substrate having a first surface opposite a second surface;

forming at least one transistor at the first surface of the semiconductor substrate;

thinning the semiconductor substrate at the second surface to produce a substantially smooth surface opposite the first surface;

growing an oxide layer on the second surface of the semiconductor substrate in an environment having a higher oxygen content than ambient; and disposing a layer comprised of titanium overlying the oxide layer wherein the layer is electrically coupled to the at least one transistor.

2. The method according to claim 1, further comprising wherein the disposing step further comprises disposing the layer such that the titanium spikes through the oxide layer and into the second surface of the semiconductor substrate.

3. The method according to claim 1, wherein the growing step includes growing the oxide layer at a temperature below 450 degrees Celsius.

4. The method according to claim 1, wherein the step of disposing the layer comprised of titanium includes sputtering the layer comprised of titanium onto the oxide layer, wherein the layer comprised of titanium consists essentially of titanium.

5. The method according to claim 1, wherein the step of disposing the layer comprised of titanium includes providing a thickness of greater than approximately 200 angstroms for the layer comprised of titanium and wherein the disposing step occurs after the growing step and without etching the second surface of the semiconductor substrate after the thinning step.

6. A method of fabricating a semiconductor device, the method comprising the steps of:

providing a silicon substrate having a first surface opposite a second surface;

forming at least one transistor at the second surface of the silicon substrate;

thinning the silicon substrate at the first surface after the forming step wherein the first surface has a maximum peak-to-valley distance of less than approximately five hundred nanometers after the thinning step;

growing an oxide layer on the first surface to a thickness of less than approximately one hundred fifty angstroms; and sputtering titanium onto the oxide layer, wherein the titanium penetrates through the oxide layer and into the first surface of the silicon substrate.

7. The method according to claim 6, wherein the first surface has a maximum peak-to-valley distance of less than approximately 500 nanometers after the thinning step.

8. The method according to claim 6, wherein the step of growing the oxide layer includes growing the oxide layer comprised of silicon dioxide and growing the silicon dioxide in an atmosphere having a higher oxygen content than ambient.

9. The method according to claim 6, wherein the step of growing the oxide layer includes growing the oxide layer at a temperature below approximately 450 degrees Celsius.

10. The method according to claim 6, wherein the step of growing the oxide layer includes providing a thickness of less than approximately 150 angstroms for the oxide layer.

11. The method according to claim 6, wherein the sputtering step occurs after the growing step and without etching the first surface of the silicon substrate after the thinning step.

12. The method according to claim 6, wherein the sputtering step includes sputtering a layer comprising platinum on the titanium and sputtering a layer comprising gold on the layer comprising platinum wherein the titanium, the layer comprising platinum, and the layer comprising gold are all sputtered in-situ.

13. The method according to claim 6, wherein the sputtering step includes sputtering a layer comprising nickel on the titanium and sputtering a layer comprising silver on the layer comprising nickel wherein the titanium, the layer comprising nickel, and the layer comprising silver are all sputtered in-situ.

14. A method of manufacturing a semiconductor device comprising:

provoding a silicon substrate having first and second surfaces opposite each other;

fabricating at least one transistor at the first surface of the silicon substrate;

thinning the silicon substrate at the second surface after the fabricating step wherein the second surface has an average peak-to-valley distance of approximately 15 to 100 nanometers and a maximum peak-to-valley distance of less than approximately 500 nanometers after the thinning step;

growing an oxide layer comprised of silicon dioxide on the second surface of the silicon substrate wherein the growing step occurs at a temperature of less than approximately 450 degrees Celsius and occurs in an environment having a higher oxygen content than ambient, wherein the oxide layer has a thickness less than approximately 150 angstroms, and wherein the growing step occurs after the thinning step;

depositing an adhesion layer comprised of titanium on the oxide layer wherein the titanium spikes through the oxide layer and into the silicon substrate and wherein depositing the adhesion layer occurs after the growing step and occurs without etching the second surface after the thinning step;

depositing a barrier layer on the adhesion layer wherein the barrier layer is deposited in-situ with the adhesion layer and wherein the barrier layer is selected from the group consisting of gold and nickel; and depositing an anti-oxidation layer on the barrier layer wherein the anti-oxidation layer is deposited in-situ with the adhesion and barrier layers and wherein the anti-oxidation layer is selected from the group consisting of gold and silver.

\* \* \* \* \*